(12) United States Patent  
Itou et al.

(10) Patent No.: US 8,283,845 B2  
(45) Date of Patent: Oct. 9, 2012

(54) PLANE EMISSION DEVICE

(75) Inventors: Norihiro Itou, Suita (JP); Takeyuki Yamaki, Ikoma-gun (JP); Nobuhiro Ide, Katano (JP); Kenji Kawano, Sakai (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 12/593,666

(22) PCT Filed: Mar. 31, 2008

(86) PCT No.: PCT/JP2008/056308  
§ 371 (c)(1),  
(2), (4) Date: Sep. 29, 2009

(87) PCT Pub. No.: WO2008/123492  
PCT Pub. Date: Oct. 16, 2008

(65) Prior Publication Data  
US 2010/0060142 A1    Mar. 11, 2010

(30) Foreign Application Priority Data  
Mar. 30, 2007  (JP) ................. 2007-095188

(51) Int. Cl.  
*H01J 5/16* (2006.01)
(52) U.S. Cl. ........................ 313/116; 313/498
(58) Field of Classification Search .......... 313/112–113, 313/498, 502–504  
See application file for complete search history.

(56) References Cited

U.S. PATENT DOCUMENTS

| | | |
|---|---|---|
| 6,791,634 B2 | 9/2004 | Ichioka et al. |
| 7,722,965 B2 | 5/2010 | Juni et al. |
| 2002/0034013 A1 | 3/2002 | Nakamura et al. |
| 2002/0094422 A1 | 7/2002 | Tsai et al. |
| 2003/0090211 A1 | 5/2003 | Komada et al. |
| 2003/0137629 A1 | 7/2003 | Ichioka et al. |
| 2003/0197457 A1 | 10/2003 | Komada et al. |
| 2004/0253427 A1 | 12/2004 | Yokogawa et al. |
| 2005/0142379 A1 | 6/2005 | Juni et al. |
| 2007/0257590 A1 | 11/2007 | Bechtel et al. |

(Continued)

FOREIGN PATENT DOCUMENTS  
CN            1638585            7/2005

(Continued)

OTHER PUBLICATIONS

English language Abstract of JP 2005-190931, Jul. 14, 2005.

(Continued)

*Primary Examiner* — Anh Mai  
*Assistant Examiner* — Brenitra Lee  
(74) *Attorney, Agent, or Firm* — Greenblum & Bernstein, P.L.C.

(57) ABSTRACT

In a plane emission device comprising a transparent substrate, a light scattering layer formed on a surface of the transparent substrate, and a luminescent body of organic or inorganic material which is formed on a surface of the light scattering layer and emits light by light or electric energy, efficiency to takeout light to outside is improved. The light scattering layer contains binder and two kinds of fillers, and when a refraction index of the binder is assumed as Nb, a refraction index of one of the two kinds of fillers is assumed as $Nf_1$, and a refraction index of the other is assumed as $Nf_2$, a relationship that $Nf_2 > Nb > Nf_1$ is satisfied. Since the light scattering layer contains two kinds of fillers, disorder occurs in critical angle when light exits from the light scattering layer to the transparent substrate, incidence rate of light into the transparent substrate rises, and efficiency to takeout the light to outside increases.

10 Claims, 3 Drawing Sheets

U.S. PATENT DOCUMENTS

| | | |
|---|---|---|
| 2008/0176041 A1 | 7/2008 | Sato et al. |
| 2008/0272689 A1 | 11/2008 | Ide et al. |
| 2009/0072733 A1 | 3/2009 | Funayama et al. |

FOREIGN PATENT DOCUMENTS

| | | |
|---|---|---|
| EP | 1548856 | 6/2005 |
| JP | 8-83688 | 3/1996 |
| JP | 10-321371 | 12/1998 |
| JP | 2003-216061 | 7/2003 |
| JP | 2003-216062 | 7/2003 |
| JP | 2005-190931 | 7/2005 |
| JP | 2005-251489 | 9/2005 |
| JP | 2005-302336 | 10/2005 |
| JP | 2006-286616 | 10/2006 |
| JP | 2006-294491 | 10/2006 |
| WO | 2005/094130 | 10/2005 |
| WO | 2005/115740 | 12/2005 |
| WO | 2005/124887 | 12/2005 |
| WO | 2006/095612 | 9/2006 |

OTHER PUBLICATIONS

English language Abstract of JP 2003-216061, Jul. 30, 2003.
English language Abstract of JP 2005-251489, Sep. 15, 2005.
English language Abstract of JP 2006-286616, Oct. 19, 2006.
English language Abstract of JP 8-83688, Mar. 26, 1996.
English language Abstract of JP 10-321371, Dec. 4, 1998.
English language Abstract of JP 2003-216062, Jul. 30, 2003.
Japan Office action, dated Sep. 20, 2011 along with a partial English translation thereof.

PLANE EMISSION DEVICE

TECHNICAL FIELD

The present invention relates to a plane emission device which is used in various kinds of display units, a display device, a back light for a liquid crystal display, or a light source of a lighting system.

BACKGROUND ART

A plane emission device emitting lights by light or electric energy, which is used for a light source of various kinds of display units, a display device, a back light, or a lighting system, has many superior characteristics such as high-luminance, high-efficiency, low-profile and light-weight. Among the plane emission devices, an organic electroluminescence device (organic EL device), which makes organic materials emit lights by electric energy from an anode and a cathode, is energetically researched and developed for practical use, because it enables high-luminance plane emission with a low voltage about several Volt, and enables the light emission with arbitrary color tone by selection of luminescent materials.

Figure 3A:
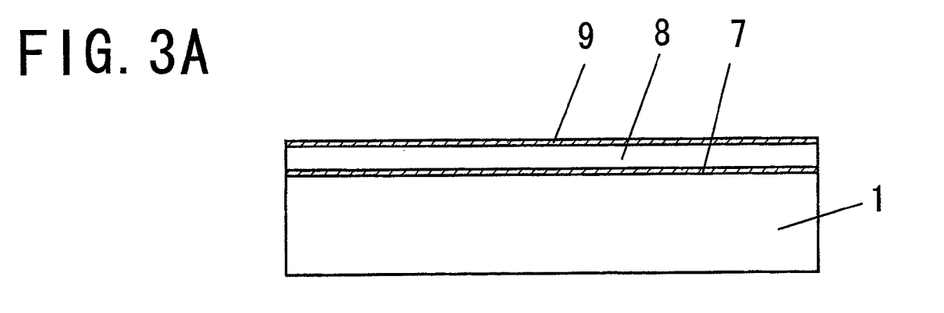
FIG. 3A is a sectional view showing a configuration of a conventional plane emission device.

The organic EL device is, as shown in FIG. 3A, configured of a transparent electrode layer 7 which is formed on a surface of a transparent substrate 1, a luminescent layer 8 which consists of an organic EL material and is formed on a surface of the transparent electrode layer 7, an opposing electrode 9 which is formed on a surface of the luminescent layer 8, and so on. Then, lights emitted in the luminescent layer 8 by applying a voltage between the transparent electrode layer 7 and the opposing electrode 9 transmits through and exits from the transparent electrode layer 7 and the transparent substrate 1.

Hereupon, in case of a lighting device consisting of a thin film like the organic EL device, exit angles of the lights emitted from the luminescent layer 8 which is thin film of a luminous body are defined by refraction index of the luminescent layer 8 and refraction indexes of media into which the emitted lights pass through, that is, the transparent electrode layer 7 and the transparent substrate 1 when the emitted lights exit. When the exit angle of the light is equal to or larger than the critical angle, the light is reflected as total reflection on a boundary face and it is confined in inside of the luminescent layer 8 and so on, and consequently, it is lost as guided wave. In calculation of the classic optics of Snell's law, when the refraction index of the luminescent layer 8 is assumed as "n", takeout efficiency η that the emitted lights can exit to outside is approximated as $\eta \approx 1/(2n^2)$. For example, when the refraction index of the luminescent layer 8 is 1.7, η≈around 17%, and thus, 80% or more of the lights is lost as guided light in lateral direction of the organic EL device, and consequently, the takeout efficiency of lights from the organic light emitting device becomes much lower.

In addition, in the case of the organic EL device using a fluorescent material for the luminescent material, among exciters which are generated by recombination of electric charges injected from the electrodes 7 and 9, it is only singlet exciters that contribute the light emission, and generation probability thereof is ¼. In other words, in consideration of only this point, efficiency becomes much lower of around 5%. In contrast, recently, a luminescent material by which light emission can be obtained from phosphorescence due to triplet exciters is developed for a method to increase the luminous efficiency of the luminescent layer in itself, so that a possibility that can improve the quantum efficiency drastically is found.

However, even if the quantum efficiency is drastically improved as above, when the takeout efficiency of lights is lower, it causes to decrease the luminous efficiency of the organic EL device due to the fact. In other words, if the takeout efficiency is improved, the luminous efficiency may be improved drastically as synergistic result.

In case of the organic EL device which is formed by laminating the luminescent layers 8 via the transparent electrode layers 7 on the surface of the transparent substrate 1, the lost light to amount to about 80% as above is mainly caused by (1) the total reflection on the boundary face between the transparent substrate 1 and air, (2) total reflection on the boundary face between the transparent electrode layer 7 and the transparent substrate 1. In other words, when a light enters into a medium of lower refraction index from a medium of higher refraction index, the light having an incident angle equal to or larger than the critical angle is total-reflected on the boundary face in concept of the total reflection, and thus, it is confined therein. When calculating ratios of (1) the total reflection on the boundary face between the transparent substrate 1 and the air and (2) the total reflection on the boundary between the transparent electrode layer 7 and the transparent substrate 1 in consideration with solid angles respectively, the former becomes about 35% and the latter becomes about 45%.

Therefore, two means of (1) reforming of the boundary face between the transparent substrate 1 and the air and (2) reforming of the boundary face between the transparent electrode layer 7 and the transparent substrate 1 are considered as the means to improve the takeout efficiency, now. With respect to the former case, a method to improve the takeout efficiency of lights by providing a scattering layer of a lens structure on the surface of the transparent substrate 1 (see Japanese Patent No. 2931211, for example) and a method to form a diffraction grating (see Japanese Unexamined Patent Publication No. 10-321371, for example) are proposed.

Figure 3B:
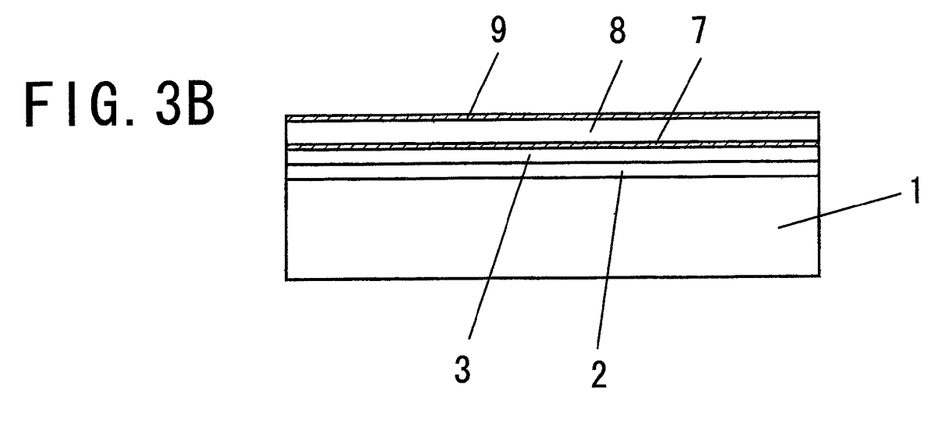
FIG. 3B is a sectional view showing a configuration of another conventional plane emission device.

With respect to the latter case, as shown in FIG. 3B, a light scattering layer 2 is formed between the transparent electrode layer 7 and the transparent substrate 1 so as to disperse lights by the light scattering layer 2. Thereby, the ratio of the total reflection occurred on the boundary face between the transparent electrode layer 7 and the transparent substrate 1 is reduced, and thus, the takeout efficiency of lights is increased. Although the light scattering department (SIC) 2 is formed by providing minute irregularity on a surface of the transparent substrate 1 facing the transparent electrode layer 7, or providing a coating resin layer containing particles on a surface of the transparent substrate 1 facing the transparent electrode layer 7, at nay event, the surface becomes irregular. Therefore, as shown in FIG. 3B, an alleviation layer 31 is formed on a surface of the light scattering layer 2 for smoothing the irregularity, and the transparent electrode layer 7 having a thin thickness is formed on the smoothed surface of the alleviation layer 31 (see Japanese Unexamined Patent Publication No. 2003-216062 or 2006-286616, for example).

However, when the alleviation layer 31 is formed between the light scattering layer 2 and the transparent electrode layer 7 as above, the lights are total-reflected on a boundary face of the alleviation layer 31 and the transparent electrode layer 7, and thus, the takeout efficiency of lights is reduced due to the total reflection, therefore, it is desired to further improve the takeout efficiency.

DISCLOSURE OF INVENTION

The present invention is conceived in view of the problems mentioned above, and purposed to provide a plane emission device which enables to improve the takeout efficiency of lights by restricting the total reflection of lights on the boundary face of the transparent electrode layer and the alleviation layer.

In order to attain the above mentioned purpose, a plane emission device in accordance with an aspect of the present invention comprises a transparent substrate, a light scattering layer formed on a surface of the transparent substrate, and a luminescent body layer of organic or inorganic which is formed on a surface of the light scattering layer and emits lights by light or electric energy, characterized by that the light scattering layer contains binder and two kinds of fillers, and when a refraction index of the binder is assumed as Nb, a refraction index of one of the two kinds of fillers is assumed as $Nf_1$, and a refraction index of the other is assumed as $Nf_2$, a relationship that $Nf_2 > Nb > Nf_1$ is satisfied.

According to such a configuration, since the light scattering layer formed between the transparent substrate and the luminescent body layer is formed to contain the binder and the two kinds of fillers satisfying the above mentioned relationship of the refraction indexes, light scattering effect is magnified, disorder occurs in critical angles when lights emitted in the luminescent body layer exit from the light scattering layer to the transparent substrate, incident efficiency of lights to the transparent substrate is increased, and takeout efficiency of lights to outside becomes much larger.

BEST MODE FOR CARRYING OUT THE INVENTION

First Embodiment

Figure 1A:
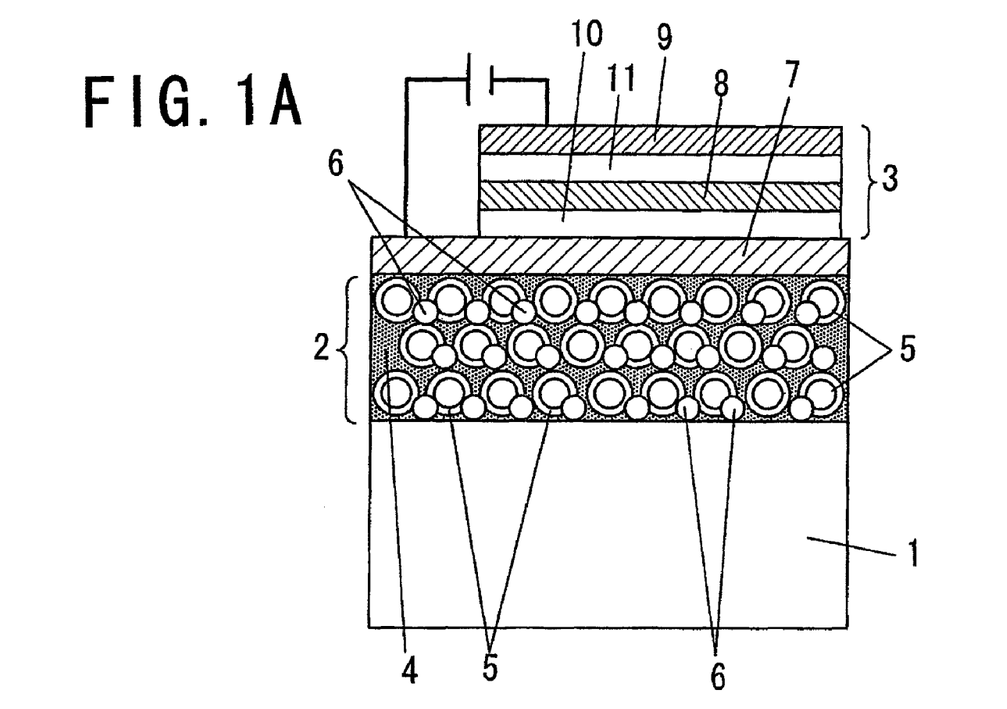
FIG. 1A is a sectional view showing a configuration of a plane emission device in accordance with a first embodiment of the present invention.
Figure 1B:
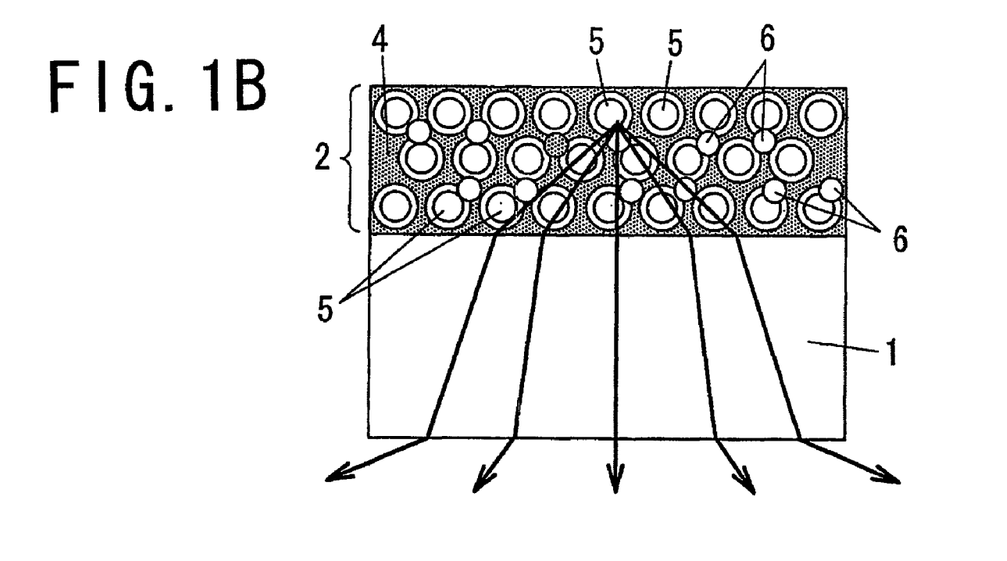
FIG. 1B is a sectional view showing a light scattering layer formed on a surface of a transparent substrate thereof.

A plane emission device in accordance with a first embodiment of the present invention is described with reference to FIG. 1A and FIG. 1B. FIG. 1A shows a configuration of a plane emission device in accordance with the first embodiment, and FIG. 1B shows a configuration of a light scattering layer 2 formed on a surface of a transparent substrate 1.

As for a luminescent body 3, an organic or an inorganic one which emits lights by light or electric energy can be used. The luminescent body 3 shown in FIG. 1A is one which emits lights owing to be activated by electric energy, such as an organic EL device. The luminescent body 3 is configured of a transparent electrode layer (anode) 7 which is formed on the light scattering layer 2, a luminescent layer 8, an opposing electrode (cathode) 9 and a hole transfer layer 10 and an electron transfer layer 11 which are provided according to need, and so on. Lights emitted in the luminescent layer 8 pass through the transparent electrode layer 7, and further pass through the light scattering layer 2 and the transparent substrate 1, and exit to outside, as shown by arrows in FIG. 1B.

As for the transparent substrate 1, a well-known transparent substrate can be used, and specifically, a rigid substrate such as soda glass or non-alkali glass, or a flexible substrate such as polycarbonate or polyethylene terephthalate can be used. A refraction index of the transparent substrate 1 is generally in a range from 1.46 to 1.6.

The light scattering layer 2 is formed to contain two kinds of fillers 5, 6 into a binder 4. This light scattering layer 2 is a coat formed on a surface of the transparent substrate 1, and it is formed by applying a liquid coating materials composition, which is prepared by mixing the fillers 5, 6 and the binder formation material, on the surface of the transparent substrate 1, and drying a coated film formed on the surface of the transparent substrate 1. The term "drying" here means to remain a solid coat by removing liquid component (or volatile component) from the coated film, and it may be heated on the occasion of drying, if necessary. In addition, heat treatment may be carried out by heating the coat after forming the coat by drying. Furthermore, the heat treatment of the coat may be carried out by continuing the heating at the time of drying. As for the method to form the coat, spin coat, spraying coat, dipping coat, or printing coat can be used, but it is not limited to these methods.

In the light scattering layer 2 formed in this way, since the fillers 5, 6 are dispersed into the binder 4 which is formed of the binder formation material, these fillers mutually form different phases. The binder 4 holds the fillers 5, 6 therein by restricting them in dispersed state. The binder 4 is formed of the binder formation material by drying the liquid coating materials composition applied to be a film state. On the occasion of drying, the binder formation material may change or not change, chemically. The binder formation material is transformed from a state that it is solved and/or dispersed into a coating materials composition to a solid state coat as a whole by being dried.

The coating materials composition is formed to be liquid state so that it can be applied on the transparent substrate 1. Therefore, the coating materials composition usually contains liquid solvent and/or dispersive agents (for example, water, alcohol such as methanol, ethanol or isopropyl alcohol, or organic flux such as toluene, xylene, methyl ethyl ketone). In addition, the coating materials composition may contain another component, if necessary. As for such another component, leveling agent for forming a flat coating film which is typified by acrylic polymer, thickening agent for controlling a thickness which is typified by ethylene glycol derivatives such as ethylene glycol, ethylene glycol monobutyl ether, acetic ethylene glycol monoethyl ether, or diethylene glycol derivatives such as diethylene glycol, diethylene glycol monobytyl ether, high boiling point flux and silane coupling agent which generates adhesion with the transparent substrate 1, and so on can be exemplified.

In the light scattering layer 2 which is formed to contain the two kinds of fillers 5, 6 into the binder 4 as above, when assuming a refraction index of the binder as "Nb", a refraction index of one of the two kinds of fillers 5, 6 as "$Nf_1$" and a refraction index of the other as "$Nf_2$", the binder 4 and the two kinds of fillers 5, 6 are selected to satisfy a relationship $Nf_2 > Nb > Nf_1$. When the refraction indexes of the binder 4 and the two kinds of fillers 5, 6 satisfy such relationship, scattering effect of lights by the light scattering layer 2 is magnified. By forming the light scattering layer 2 on the boundary face between the transparent electrode layer 7 and the transparent substrate 1, disorder occurs in critical angles on the boundary face between the transparent electrode layer 7 and the transparent substrate 1, so that a ratio of the lights enter into the transparent substrate 1 from the transparent electrode layer 7 among the lights emitted in the organic luminescent layer 8 is increased, and consequently, takeout efficiency of lights becomes higher.

As for the materials of the fillers 5, 6, aerogel fine particles, hollow silica fine particles, hollow fine particles formed of polymer, organic polymer fine particles, metal oxide fine particles can be exemplified. In addition, it is preferable that particles of the fillers 5, 6 are processed surface coating treatment which does not vary the refraction indexes such as an interfacial active agent treatment or thin film coating treatment so as to increase the scattering performance.

Although the refraction indexes $Nf_1$, $Nf_2$ of the fillers 5, 6 are generally in a range from 1.2 to 2.5, it is desirable that the refraction index $Nf_1$ of one filler among the two kinds fillers 5, 6 is equal to or smaller than 1.4. A lower limit of the refraction index $Nf_1$ is not limited in particular, but it is generally around 1.2. In this way, by selecting the refraction index $Nf_1$ of one filler equal to or smaller than 1.4, the refraction index of the light scattering layer 2 is decreased drastically. Consequently, the light scattering layer 2 having high scattering performance and low refraction index can be formed.

In addition, it is desirable that difference between the refraction indexes $Nf_1$ and $Nf_2$ of the two kinds of fillers 5, 6 is equal to or larger than 0.5. By providing the difference of refraction indexes equal to or larger than 0.5 between the refraction indexes $Nf_1$ and $Nf_2$ of the two kinds of fillers 5, 6, intensity of light scattering of the light scattering layer 2 is increased, and consequently, the takeout efficiency of lights is improved. Although an upper limit of the difference of refraction index between the refraction indexes $Nf_1$ and $Nf_2$ of the two kinds of fillers 5, 6 is not limited in particular, it is desirable to be equal to or smaller than around 1.3 in general.

In addition, it is preferable that the mean particle diameters of the fillers 5, 6 are in a range from 5 to 200 nm. It is because that if the mean particle diameters of the fillers 5, 6 are made larger exceeding 200 nm, surface roughness of the light scattering layer 2 formed to contain the fillers 5, 6 becomes larger, and thus, reliability of each layers constituting the plane emission body such as the transparent electrode layer 7, the luminescent layer 8 and the opposing electrode 9 formed thereon may be lowered. Alternatively, if the mean particle diameters of the fillers 5, 6 are too small, light scattering performance becomes insufficient, so that it is preferable that the mean particle diameters of the fillers 5, 6 are equal to or larger than 5 nm. At this time, when the surface roughness of the light scattering layer 2 becomes larger (for example, Ra=20 nm or more), it is possible to provide an alleviation layer (flattening layer) (see FIG. 3B) on a surface of the light scattering layer 2. Material and forming method of the alleviation layer are not limited in particular, if the roughness Ra can be equal to or smaller than 20 nm.

The two kinds of fillers 5, 6 preferably have different mean particle diameters. In such a case, it is preferable that the mean particle diameter of one filler is equal to or larger than twofold of the mean particle diameter of the other filler. In this way, by selecting the mean particle diameter of one filler 5 is equal to or larger than twofold of the mean particle diameter of the other filler 6, the fillers 5, 6 are dispersed in the binder 4 in a state that particles of the filler 6 having the smaller mean particle diameter get into a space between particles of the filler 5 having larger mean particle diameter. Consequently, dispersibility of the fillers 5, 6 in the binder 4 is improved, so that it is possible to form the light scattering layer 2 in which the fillers 5, 6 are evenly dispersed. Although an upper limit of the difference of the mean particle diameters of the two kinds of fillers 5, 6 is not limited in particular, it is desirable that the difference of the mean particle diameters of both fillers is in a range from 15 to 50 nm. In addition, the particle diameters and the mean particle diameters of the fillers 5, 6 are values measured with using a particle size distribution measuring apparatus using laser diffraction doctrine, which will be described later.

On the other hand, as for the material of the binder 4, organic polymer, metal oxide, silica porous material, and so on can be exemplified. A material having a refraction index satisfying the above mentioned relationship is selected among these materials. The refraction index Nb of the binder 4 is generally in a range from 1.45 to 1.60.

Among the combinations of the above mentioned materials of the binder 4 and the fillers 5, 6, it is preferable that the fillers 5, 6 are selected at least one kind of aerogel fine particles, hollow silica fine particles and hollow fine particles formed of polymer, and the binder 4 is selected at least one kind of organic polymer and metal oxide.

A film thickness of the light scattering layer 2 is not limited in particular, but it is preferable in a range from 100 to 2000 nm in general. In addition, a rate of content of the fillers 5, 6 to the binder 4 is not limited in particular, but it is preferable that a mass ratio of the fillers 5, 6 to the binder 4 is selected to be from 10:90 to 70:30 in general. Furthermore, a ratio of the two kinds of fillers 5, 6 is not limited in particular, but it is preferable that one having a smaller refraction index $Nf_1$ and one having a larger refraction index $Nf_2$ are combined in a mass ratio from 1:9 to 9:1. In addition, the fillers contained in the binder 4 are not limited to the above mentioned two kinds of fillers, 5, 6, but it is possible to further contain a third filler and so on. In such a case, at least the two kinds of fillers 5, 6 are necessary to have the above mentioned relationships for the binder 4.

A refraction index of the light scattering layer 2 is generally in a range from 1.30 to 1.70, but it is preferable to select to be equal to or smaller than the refraction index of the transparent substrate 1. By setting the refraction index of the light scattering layer 2 equal to or smaller than the refraction index of the transparent substrate 1, it is possible to reduce a rate of lights which are total-reflected among the lights which enter into the transparent substrate 1 from the light scattering layer 2, and thus, the takeout efficiency of lights can be increased.

In addition, it is preferable that a haze value ((diffuse transmittance rate/full transmittance rate)×100) of the light scattering layer 2 is selected to be in a range from 2 to 50. By setting the haze value of the light scattering layer 2 in such a region, it is possible to increase the takeout efficiency of lights without disfigurement in a transparent organic plane emission device, for example. In addition, in case that the haze value of the light scattering layer 2 is higher, even though the takeout efficiency of lights is improved, it may be whitened so as to damage the appearance of the plane emission device.

Subsequently, the plane emission device shown in FIG. 1A is described. The luminescent body 3 formed on the light scattering layer 2 is an organic EL device, and it is sufficient to have a known structure of the organic EL device. For example, it may be an EL device structure called multi-photoemission device provided a plurality of organic luminescent layers 8 in series via electric charge production layers such as transparent electrodes between anode and cathode electrodes so as to increase luminescence intensity.

Among electrodes 7 and 9 constituting the organic EL device, a transparent electrode layer 7 having light transmittance characteristics is used for at leas one electrode. In addition, electrodes having light transmittance characteristics may be used for both electrodes 7 and 9, if necessary. As for materials of the electrodes having light transmittance characteristics, it is possible to use an arbitrary one if it may not disturb the effects of the present invention. For example, an indium-tin oxide (ITO), an indium-zinc oxide (IZO), a tin oxide, a metal ultrathin film such as Au, an electroconductive macromolecule, an electroconductive organic material, an organic layer containing dopant (doner or acceptor), a mixture of an electroconductive material and an electroconductive organic material (containing macromolecule), or a layered product of these, and so on can be exemplified. These transparent electrodes are usually formed with a vapor phase epitaxial method such as sputtering method or ion plating method.

Hereupon, it is preferable that the transparent electrode layer 7 is formed of an application type electric conductive layer, when forming the transparent electrode layer 7 on a surface of the light scattering layer 2. When the surface of the light scattering layer 2 is rough so that irregularity of several hundred nm is formed, if the transparent electrode layer 7 is directly formed on the surface of the light scattering layer 2 by the vapor phase epitaxial method, a film may grow following to the irregularity, so that a transparent electrode layer 7 having irregularity on a surface thereof is formed, and thus, reliability of the device may fall. Therefore, when the transparent electric conductive layer is formed on the surface of the light scattering layer 2 by an application method to apply a material for electrode in paste form, the irregularity of several hundred nm is smoothed by fluidity of the material, so that the transparent electrode layer 7 having a flat surface is formed. In such a case, since characteristics of conductivity are not so good by only the application type transparent electric conductive material, it is preferable to form the transparent electrode layer 7 as a double layered structure by providing the application type transparent electric conductive layer on the surface of the light scattering layer 2 as a foundation layer, and after that, a transparent electric conductive layer is laminated thereon by the vapor phase epitaxial method.

As for the organic material that constitute the organic luminescent layers 8 of the organic EL device, for example, anthracene, naphthalene, pyrene, tetracene, coronene, perylene, phthaloperylene, naphthaloperylene, diphenyl butadiene, tetra phenyl butadiene, coumalin, oxadiazole, bisbenzoxazoline, bisstyryl, cyclopentadiene, coumalin, oxadiazole, bisbenzoxazoline, bisstyryl, cyclopentadiene, (SIC) quinoline metal complex, tris(8-hydroxyquinolinate) aluminum complex, tris(4-methyl-8-quinolinate) aluminum complex, tris(5-phenyl-8-quinolinate) aluminum complex, aminoquinoline metal complex, benzoquinoline metal complex, tri-(p-pterphenyl-4-yl) amine, pyran, quinacridone, rubrene, and derivative of them, or 1-aryl-2,5-di(2-thienyl) pyrrole derivative, distyryl benzene derivative, styryl-arylene derivative, styryl-amine derivative, and chemical compound or macromolecule having group consists of luminescent compound of those in a part of molecule, and so on can be exemplified. In addition, it is possible to use so-called phosphorescence luminescence material, luminescent material such as Ir complex, Os complex, Pt complex, or europium complexes, chemical compound or macromolecule having them in molecule, further to chemical compound derived from fluorescent pigment typified by the above mentioned chemical compounds. These materials can be selectively used according to need.

In addition, it is possible to form a hole transfer layer 10, an electron transfer layer 11 and a buffer layer for improving carrier injection characteristics from the transparent electrode layer 7 and the opposing electrode 9 or a layer to reduce damage at the time of forming the electrodes between the organic luminescent layer 8, and the transparent electrode layer 7 and the opposing electrode 9. As for these layers, an alkali metal doped organic layer, a copper phthalocyanine layer, an acceptor doped organic layer, and so on can be formed, for example.

Generally, since the organic EL device will be deteriorated by external factors due to moisture or oxygen, it is preferable to perform seal encapsulation to ensure a long life. In particular, the film thickness of the light scattering layer 2 is thicker than that of another layer, so that moisture or oxygen can easily intrude from ends of the light scattering layer 2. Then, it is preferable that the light scattering layer 2 is formed inside of a sealed portion when sealing the plane emission device. Thereby, it is possible to prevent the intrusion of moisture or oxygen from the ends of the light scattering layer 2. In addition, when emitting the plane emission device in large area, luminance at the center of emitting face may differ from that at a position near to power feeding point due to affect of voltage drop in the transparent electrode layer 7. Therefore, an auxiliary electrode may be formed above or below the transparent electrode layer 7. As for a material of the auxiliary electrode, a known one can be used.

In addition, although the organic EL device which is an organic luminescent body emitting lights by electric energy is exemplified as the luminescent body 3 in FIG. 1A, it is not limited to this, and the luminescent body may be formed of an inorganic EL device emitting lights by electric energy or an organic or inorganic fluorescent body emitting lights by light energy.

PRACTICAL EXAMPLES

Subsequently, the plane emission device in accordance with the present invention is specifically described by practical examples. In addition, the weight average molecular weights were measured by GPC (gel permeation chromatography) as corresponding value of calibration curve which is formed of normal polystyrene with using a measuring machine of "HLC-8120" product of Tosoh Corp.

Practical Example 1

A solution was obtained by adding 803.5 masses part of isopropyl alcohol into 86.8 masses part of tetraethoxysilane, and further adding 34.7 mass part of γ-methacryloxypropyl-trymethoxysilane and 75 mass part of 0.1N-nitric acid, and mixing it well with by dispersion mill. The obtained solution was agitated two hours in thermostatic oven at 40 degrees Celsius, and thus, 5 weight % of silicone resin solution was obtained as a binder silicone resin having 1050 weight average molecular weight.

Subsequently, a silicone resin solution containing hollow silica fine particles was obtained by adding a sol that an IPA dispersed sol (solid content: 20 mass %, dispersion medium: isopropyl alcohol, made by Catalysts and Chemicals Ltd.) of hollow silica fine particles (mean particle diameter: 60 nm, outer shell thickness: 10 nm) was diluted by isopropyl alcohol to be 5 mass % into the silicone resin solution so that hollow silica fine particles/silicone resin (condensation chemical compound conversion) became 35/30 on the basis of the solid content mass standard. Furthermore, a final coating materials composition was obtained by adding a sol that a methyl ethyl ketone dispersed sol (solid content: 20 mass %, a product of Catalysts and Chemicals Ltd.) of silica-titania compound fine particles (mean particle diameter: 10 to 20 nm) which were coated faces of titania particles with silica was diluted by isopropyl alcohol to be 5 mass % into this solution so that hollow silica fine particles/silica-titania compound fine particles/silicone resin (condensation chemical compound conversion) became 35/35/30 on the basis of the weight average molecular weights.

In addition, the above mentioned "condensation chemical compound conversion" is a mass when assuming that existing Si was $SiO_2$ in the case of tetraalkoxysilane, or a mass when assuming that existing Si was $SiO_{1.5}$ in the case of trialkoxysilane.

Hereupon, the refraction index Nb of the silicone resin as the above mentioned binder formation material was 1.40, the refraction index $Nf_1$ of the hollow silica fine particles was 1.25 and the refraction index $Nf_2$ of the silica-titania fine particles was 1.85, which satisfied the relationship of $Nf_2 > Nb > Nf_1$.

In addition, these refraction indexes were measured as follows. As for the binder formation material, the above mentioned coating materials composition was coated on a surface of a transparent substrate and dried to be a thin film, and after that, the refraction index of the tin film was measured with an ellipsometer. The refraction indexes of the hollow silica fine particles and the silica-titania fine particles were measured with using an immersion method. Specifically, fine particles were dispersed into various kinds of refraction liquids each having different refraction index, and, a refraction index of a refraction liquid when haze value became zero was decided as the refraction index of the particles. In addition, the haze value was measured with a hazemeter (a product of NIPPON DENSHOKU INDUSTRIES CO. LTD., 300A) based on JIS-K-7136. The mean particle diameters of the hollow silica fine particles and the silica-titania fine particles were respectively 60 nm and 10 to 20 nm as mentioned above, and these particle diameters were measured with a particle size distribution measuring device (a product of Horiba, Ltd.) using the laser diffraction doctrine.

Subsequently, a light scattering layer 2 of a thickness about 500 nm was formed by processes that a non-alkali glass sheet (a product of Corning Incorporated, "No. 1,737" having a refraction index 1.51) was used for the transparent substrate 1, the above mentioned coating materials composition was applied on a surface of the transparent substrate 1 with a spin coating machine in a condition of 1000 rpm, a coating film was formed by drying the applied coating materials composition, and the coating film was heat treated by burning at 200 degrees Celsius for 30 minutes. The refraction index of the light scattering layer 2 obtained by this way was 1.45, which was smaller than the refraction index of the transparent substrate 1. In addition, the haze value of the light scattering layer 2 was 3.0.

Subsequently, sputtering was performed on the light scattering layer 2 formed as above with an ITO (indium-tin oxide) target (a product of Tosoh company), so that a transparent electrode layer 7 having a thickness 120 nm and a sheet resistance 15Ω/□ was formed as an anode. Such transparent electrode layer 7 was dried and performed with UV-O3 (SIC) process for 15 minutes after processing a ultrasonic cleaning with acetone, pure water, isopropyl alcohol for 15 minutes.

Subsequently, the transparent substrate 1 to which the light scattering layer 2 and the transparent electrode layer 7 were formed was set in a vacuum evaporation apparatus, and a film of N, N'-diphenyl-N,N'-bis(1-naphthyl)-1,1'-biphenyl-4,4'-diamine (NPB) (a product of eRay company) having a thickness of 40 nm was formed on the transparent electrode layer 7 as a hole transfer layer 10.

Subsequently, a film of aluminum-tris(8-hydroxyquinoline) (Alq) (a product of eRay company) having a thickness of 60 nm was formed on the hole transfer layer 10 as an organic luminescence layer 8 and serving as an electron transfer layer. Furthermore, a film of LiF (a product of KOJUNDO CHEMICAL LABORATORY CO., LTD) having a thickness of 1 nm was formed thereon as an electron injection layer (or an electron transfer layer) 11. Finally, a film of Al (a product of KOJUNDO CHEMICAL LABORATORY CO., LTD) having a thickness of 10 nm was formed on the electron injection layer 11 by vacuum evaporation as an opposing electrode serving as a cathode, and consequently, an organic EL device was formed as the luminescent body 3.

After that, the transparent substrate 1 on which the above mentioned respective layers were formed was transmitted to a glove box of dry nitrogen atmosphere at dew point equal to or less than −80 degrees Celsius without exposing to air. On the other hand, a seal cap made of a glass was previously prepared that a water-absorption agent (a product of DYNIC CORPORATION) was pasted thereon and a seal agent of ultraviolet curing resin was applied to circumference department of the sealing cap. Subsequently, the seal cap was attached to the transparent substrate by the seal agent to enclose the organic EL device and the seal agent was hardened by ultraviolet irradiation in the glove box, so that a plane emission device was obtained by sealing the organic EL device (luminescent body) 3 by the seal cap.

Practical Example 2

In order to make the refraction index of the light scattering layer 2 smaller than the refraction index of the transparent substrate 1, a coating materials composition was prepared by adding hollow silica fine particles/silica-titania compound fine particles/silicone resin (condensation chemical compound conversion) into silicone resin solution obtained in the above mentioned practical example 1 so as to be 60/10/30 on the basis of solid content mass standard, and a light scattering layer 2 was formed with this coating materials composition similar to the practical example 1. The refraction index of the light scattering layer 2 was 1.39 which was smaller than the refraction index 1.51 of the transparent substrate 1. Then, an organic EL device (luminescent body) 3 was formed on the light scattering layer 2 similar to the practical example 1, and thus, a plane emission device was obtained.

Practical Example 3

In order to make the refraction index of the light scattering layer 2 larger than the refraction index of the transparent substrate 1, a coating materials composition was prepared by adding hollow silica fine particles/silica-titania compound fine particles/silicone resin (condensation chemical compound conversion) into silicone resin solution obtained in the above mentioned practical example 1 so as to be 60/10/30 on the basis of solid content mass standard, and a light scattering layer 2 was formed with this coating materials composition similar to the practical example 1. The refraction index of the light scattering layer 2 was 1.63 which was larger than the refraction index 1.51 of the transparent substrate 1. Then, an organic EL device (luminescent body) 3 was formed on the light scattering layer 2 similar to the practical example 1, and thus, a plane emission device was obtained.

Practical Example 4

A light scattering layer 2 was formed similar to the practical example 1. Subsequently, a thermal decomposition type transparent electric conductive ITO paste (a product of SUMITOMO METAL MINING CO., LTD.) was printing-coated on the light scattering layer 2 with screen printing method, dried at 120 degrees Celsius for 20 minutes, and after that, heating process was performed at 350 degrees Celsius for one hour, and consequently, a transparent electrode layer 7 was formed as an anode. Subsequently, an organic EL device (luminescent body) 3 was formed similar to the practical example 1, and thus, a plane emission device was obtained.

Comparative Example 1

An organic EL device (luminescent body) 3 was formed on a surface of a non-alkali glass similar to the practical example 1 without forming the light scattering layer 2, and thus, a plane emission device was obtained.

Comparative Example 2

A coating materials composition was prepared by adding a sol of hollow silica fine particles into silicone resin solution obtained in the above mentioned practical example 1 so that hollow silica fine particles/silicone resin (condensation chemical compound conversion) became 70/30 on the basis of solid content mass standard (silica-titania fine particles were not added). A light scattering layer 2 was formed with this coating materials composition similar to the practical example 1, and an organic EL device (luminescent body) 3 was formed similar to the practical example 1, and thus, a plane emission device was obtained.

With respect to the plane emission devices of the practical examples 1 to 4 and the comparative examples 1 and 2 obtained as above, characteristic evaluation was carried out. The characteristic evaluation was carried with using a DC power supply (a product of Keithley Instruments Inc.) and a luminance meter (a product of TOPCON CORPORATION) under a condition that a current value flowing inside the organic EL device was fixed to 10 mA/cm$^2$. Results are shown in table 1. In addition, there is no notable difference in the current/voltage characteristics in each example.

TABLE 1

| | Voltage (V) | Luminance (cd/m$^2$) | Current Efficiency (cd/A) |
|---|---|---|---|
| Practical Example 1 | 4.43 | 476 | 4.76 |
| Practical Example 2 | 4.40 | 490 | 4.90 |
| Practical Example 3 | 4.42 | 400 | 4.00 |
| Practical Example 4 | 4.49 | 450 | 4.50 |
| Comparative Example 1 | 4.38 | 330 | 3.30 |
| Comparative Example 2 | 4.39 | 340 | 3.40 |

As can be seen from table 1, it is confirmed that the device in each practical example 1 to 4 had a higher luminance and higher takeout efficiency of lights than those in the comparative examples 1 to 2.

Practical Example 5

A solution was obtained by adding 803.5 masses part of isopropyl alcohol into 86.8 masses part of tetraethoxysilane, and further adding 34.7 mass part of γ-methacryloxypropyltrimethoxysilane and 75 mass part of 0.1N-nitric acid, and mixing it well with by dispersion mill. The obtained solution was agitated two hours in thermostatic oven at 40 degrees Celsius, and thus, 5 weight % of silicone resin solution was obtained as a binder silicone resin having 1050 weight average molecular weight.

Subsequently, a coating materials composition was obtained by adding a sol that an IPA dispersed sol (solid content: 20 mass %, dispersion medium: isopropyl alcohol, made by Catalysts and Chemicals Ltd.) of hollow silica fine particles (mean particle diameter: 60 nm, outer shell thickness: 10 nm) was diluted by isopropyl alcohol to be 5 mass %, and a sol that a methyl ethyl ketone dispersed sol (solid content: 20 mass %, a product of Catalysts and Chemicals Ltd.) of titania compound fine particles (mean particle diameter 10 nm) was diluted by isopropyl alcohol to be 5 mass % into this solution so that hollow silica fine particles/titania compound fine particles/silicone resin (condensation chemical compound conversion) became 63/7/30 on the basis of the weight average molecular weights.

Hereupon, the refraction index Nd of the silicone resin of the above mentioned binder formation material was 1.48, the refraction index $Nf_1$ of the hollow silica fine particles was 1.25 and the refraction index $Nf_2$ of the titania fine particles was 2.00, which satisfied the relationship of $Nf_2 > Nb > Nf_1$.

Subsequently, a light scattering layer 2 of a thickness about 1000 nm was formed by processes that a non-alkali glass sheet (a product of Corning Incorporated, "No. 1,737" having a refraction index 1.51) was used for the transparent substrate 1, the above mentioned coating materials composition was applied on a surface of the transparent substrate 1 with a spin coating machine in a condition of 1000 rpm, a coating film was formed by drying the applied coating materials composition, and the coating film was heat treated by burning at 200 degrees Celsius for 30 minutes. The refraction index of the light scattering layer 2 obtained by this way was 1.38, which was smaller than the refraction index of the transparent substrate 1. In addition, the haze value of the light scattering layer 2 was 2.0.

Subsequently, a film of tris(8-hydroquinoline) alum ("Alq3" product of DOJINDO LABORATORIES) with thickness of 100 nm was formed on the light scattering layer 2, and thin film of fluorescent body was formed as a luminescent layer 8, and thus, a plane emission device was obtained.

Practical Example 6

A coating materials composition was prepared by adding hollow silica fine particles/titania fine particles/silicone resin (condensation chemical compound conversion) into the silicone resin solution obtained in the above mentioned practical example 5 so as to be 49/21/30 on the basis of solid content mass standard, and a light scattering layer 2 was formed with using this coating materials composition similar to the practical example 5, and thus, a plane emission device was obtained.

Practical Example 7

A coating materials composition was prepared by adding hollow silica fine particles/titania fine particles/silicone resin (condensation chemical compound conversion) into the silicone resin solution obtained in the above mentioned practical example 5 so as to be 42/28/30 on the basis of solid content mass standard, and a light scattering layer 2 was formed with using this coating materials composition similar to the practical example 5, and thus, a plane emission device was obtained.

Comparative Example 3

A plane emission device was obtained similar to the practical example 5 other than no light scattering layer 2 was formed and a thin film of fluorescent body was directly formed on a surface of a transparent substrate 1 of a non-alkali glass.

Comparative Example 4

A coating materials composition was prepared by adding a sol of hollow silica fine particles into silicone resin solution obtained in the above mentioned practical example 1 (SIC) so that hollow silica fine particles/silicone resin (condensation chemical compound conversion) became 70/30 on the basis of solid content mass standard (titania fine particles were not added). A light scattering layer 2 was formed with this coating materials composition similar to the practical example 5, and a thin film of a fluorescent body was formed similar to the practical example 5, and thus, a plane emission device was obtained.

With respect to the plane emission devices of the practical examples 5 to 7 and the comparative examples 3 to 4 obtained as above, luminance value on a surface of the transparent substrate 1 was measured with using a luminance meter (a product of TOPCON CORPORATION) under irradiating Ultraviolet fluorescent lamp of 20 W on the thin film of fluorescent body. Results are shown in table 2. In addition, there is no notable difference in the emission spectrum in each example.

TABLE 2

|  | Luminance (cd/m$^2$) |
|---|---|
| Practical Example 5 | 8.2 |
| Practical Example 6 | 13.3 |
| Practical Example 7 | 10.3 |
| Comparative Example 3 | 3.9 |
| Comparative Example 4 | 7.4 |

As can be seen from table 2, it is confirmed that the device in each practical example 5 to 7 had a higher luminance and higher takeout efficiency of lights than those in the comparative examples 3 to 4.

Second Embodiment

Figure 2A:
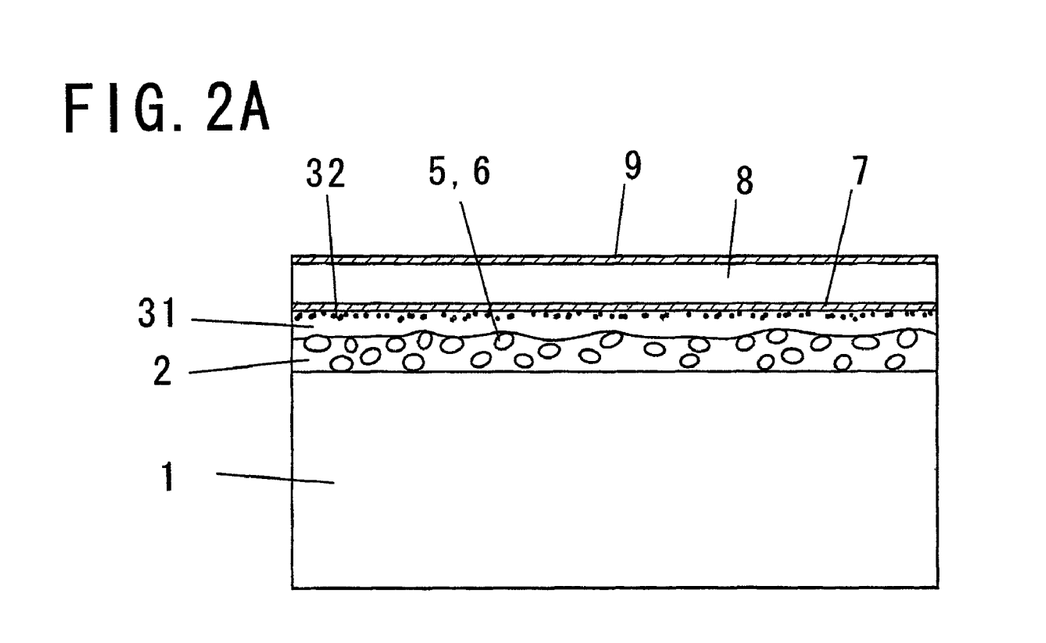
FIG. 2A is a sectional view showing a configuration of a plane emission device in accordance with a second embodiment of the present invention.
Figure 2B:
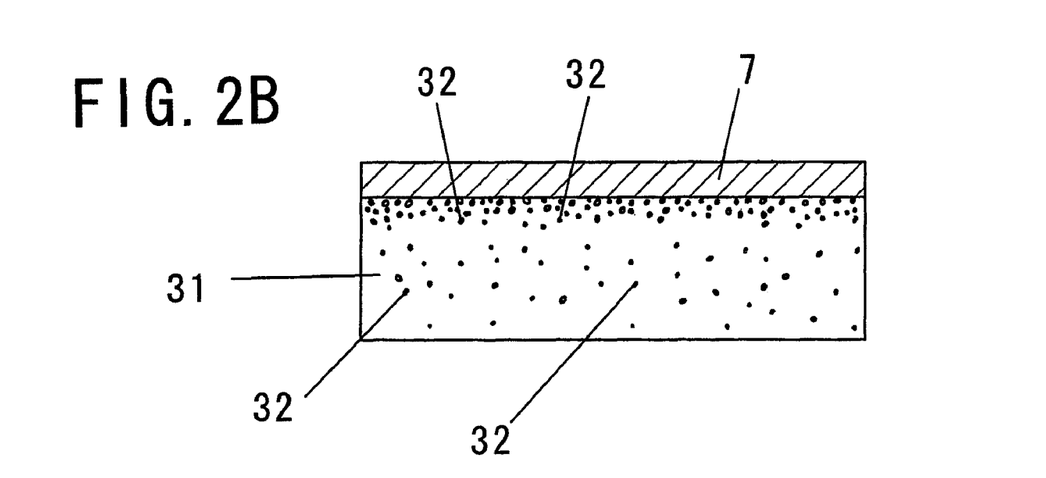
FIG. 2B is a sectional view showing an alleviation layer thereof.

Subsequently, a plane emission device in accordance with a second embodiment of the present invention is described with reference to FIG. 2A and FIG. 2B. FIG. 2A shows a configuration of a plane emission device that a luminescent body 3 is formed on a surface of a light scattering layer 2 opposite to a transparent substrate 1, and FIG. 2B shows a configuration of an alleviation layer 31 formed on the light scattering layer 2. In the second embodiment, an alleviation layer 31 is formed between the light scattering layer 2 and a transparent electrode layer 7.

As for a material of the transparent substrate 1, any one can be used without limitation in particular, if it can transmit light, and a rigid transparent such as a soda glass or a non-alkali glass, or a flexible transparent plastic plate such as polycarbonate or polyethylene terephthalate can be used.

The light scattering layer 2 provided on a surface of the transparent substrate 1 is sufficient to have a structure to scatter lights, and it is preferable to be formed by coating a binder containing particles on a surface of the transparent substrate 1 like the above mentioned first embodiment. However, it may be a layer having minute irregularity formed on the surface of the transparent substrate 1, which is formed by patterning a resin coat on the surface of the transparent substrate 1, or by performing surface treatment such as sandblasting to the surface of the transparent substrate 1. A structure for scattering lights may be isotropic scattering or directive scattering, and it should be chosen appropriately according to lights or angles which are desired to be taken out.

When coating a binder containing particles as the light scattering layer 2, transparent particles are used as the particles. For example, $TiO_2$, $SiO_2$, $ZrO_2$, $Al_2O_3$, $Ta_2O_3$, $ZnO_2$, $Sb_2O_3$, $ZrSiO_4$, zeolite or porous material of them or inorganic particle consisting mainly of them, or organic particles such as acryl resin, styrene resin, polyethylene terephthalate resin, silicone resin, and so on can be exemplified. Particle diameters of such particles may be in a range from 100 nm to 20 μm for generating effective Mie scattering.

As for the binder, polyethylene, polypropylene, polyethylene terephthalate, polymethyl methacrylate, polystyrene, polyester sulfone, polyarylate, polycarbonate resin, polyurethane, acryl resin, poly acryl nitril, poly vinyl acetal, polyamide, polyimide, diacrylicphthalate resin, cellulose type resin, polyvinyl chloride, polyvinylidene chloride, polyvinyl acetate, or other thermoplastic resin, or copolymer of two or more kinds of monomers constituting these resins can be exemplified. In addition, a silica porous material consisting of polysiloxane can be used as a binder. Such polysiloxane is obtained by condensation polymerization of alkoxysilane such as tetrakissilane or partial hydrolysate of them.

A difference between the refraction index of the binder and the refraction index of particles as the light scattering body is preferably in a range from 0.01 to 2, usually. If the difference between the refraction indexes is too small, it is difficult to obtain the effective Mie scattering, alternatively, if the difference between the refraction indexes is too large, backscattering increases, so that takeout efficiency of lights may not be increased sufficiently.

As for the method to coat the coating material obtained by compounding the particles into the binder on the surface of the transparent substrate 1, spin coating, dip coating, die coating, casting, spraying coat, gravure coating can be exemplified. The film thickness of the light scattering layer 2 is not limited in particular, but preferably in a range from 0.1 to 20 μm.

In addition, it is preferable that the light scattering layer 2 is formed with two kinds of fine particles respectively having different refraction indexes. Furthermore, a light scattering layer 2 containing particles suitable for the Mie scattering may be further formed on the light scattering layer 2 containing such two kinds of fine particles on the surface of the transparent substrate 1.

Even though the light scattering layer 2 is formed by any of the above mentioned methods, the surface of the light scattering layer 2 becomes a rough surface having irregularity. For example, when the light scattering layer 2 is formed of a coating material containing particles, the irregularity occurs due to protrusion of particles from the surface of the light scattering layer 2. Therefore, if the transparent electrode layer 7 is directly formed on the light scattering layer 2, the transparent electrode layer 7 may be formed to follow the irregularity because film thickness of the transparent electrode layer 7 is thin. Consequently, it may cause a problem in electric characteristics or occurrence of short circuit. Thus, the alleviation layer 31 is formed on the surface of the light scattering layer 2 opposite to the transparent substrate 1 so as to fill the irregularity on the surface of the light scattering layer 2, and the transparent electrode layer 7 is formed on the flat surface of the alleviation layer 31.

This alleviation layer 31 can be formed of a resin coating layer. As for the material of the coating resin, it is not limited in particular if it has transparency. For example, polyester, polyether, polyether ketone, polyimide, polyamide, polyimide amide, epoxy, polyurethane, polyurethane acrylate, polycarbonate can be exemplified. Above all, it is preferable to use thermosetting resin such as polyimide, polyamide imide, epoxy, polyurethane.

The alleviation layer 31 is formed by hardening the coating resin by heating after coating it on the surface of the light scattering layer 2. The film thickness of the alleviation layer 31 is not limited in particular, but it is preferable in a range from 1 to 20 μm.

The refraction index of the resin forming the alleviation layer 31 is preferably higher than the refraction index of the transparent electrode layer 7 or a difference between the refraction indexes is small even if it is smaller than the refraction index of the transparent electrode layer 7, in order to introduce more amount of lights into the light scattering layer 2 by reducing total reflection on a boundary face between the transparent electrode layer 7 and the alleviation layer 31. Furthermore, when the light scattering layer 2 is formed by coating, the refraction index of the resin forming the alleviation layer 31 is preferably smaller than the refraction index of the light scattering layer 2 or a difference between the refraction indexes is small even if it is larger than the refraction index of the light scattering layer 2.

Ideally, it is preferable that the refraction index in the alleviation layer 3 is slanted to be gradually higher or lower from the transparent electrode layer 7 side to the light scattering layer 2 side, the refraction index of the alleviation layer 31 becomes substantially the same as the refraction index of the transparent electrode layer 7 on the boundary face to the transparent electrode layer 7, and the refraction index of the alleviation layer 31 becomes substantially the same as the refraction index of the light scattering layer 2 on the boundary face to the light scattering layer 2. In such a case, there is no optical boundary face on which the refraction indexes vary between the alleviation layer 31 and the transparent electrode layer 7 or the light scattering layer 2, so that loss due to the total reflection on the boundary face can be eliminated.

After forming the alleviation layer 31 on the surface of the light scattering layer 2 as mentioned above, the transparent electrode layer 7 is formed on the surface of the alleviation layer 31 opposite to the light scattering layer 2. As for the material of the transparent electrode layer 7, it is possible to use an arbitrary one if it may not disturb the effects of the present invention. For example, an indium-tin oxide (ITO), an indium-zinc oxide (IZO), a tin oxide, a metal ultrathin film such as Au, an electroconductive macromolecule, an electroconductive organic material, an organic layer containing dopant (doner or acceptor), a mixture of an electroconductive material and an electroconductive organic material (containing macromolecule), or a layered product of these can be exemplified. The transparent electrode layer 7 is usually formed with a vapor phase epitaxial method such as sputtering method or ion plating method. Film thickness of the transparent electrode layer 7 is not limited in particular, but it is preferable in a range from 50 to 300 nm.

At the occasion of forming the transparent electrode layer 7, heat treatment is performed to anneal the material of the electrode. The heat treatment is performed at a high temperature exceeding the curing temperature which is the heating temperature necessary to harden the resin forming the alleviation layer 31. When the heat treatment is performed at the temperature higher than the hardening temperature of the resin forming the alleviation layer 31, occurrence of voids (bubbles) 6 (SIC) is observed in the alleviation layer 31. The mechanism how the voids 32 occur is not always clear, but the following reason is thought about. That is, since the resin forming the alleviation layer 31 is heated at the temperature higher than the hardening temperature, this resin for the alleviation layer 31 hardens and constricts. However, the portion of the alleviation layer 31 appressed to the transparent electrode layer 7 is restricted to constrict, so that it is considered that the portion will become extended state for other portion, and thus, the voids 32 are generated as air gaps in the resin forming the alleviation layer 31.

Therefore, as shown in FIG. 2B, the voids 32 are chiefly generated in the vicinity of the boundary between the alleviation layer 31 and the transparent electrode layer 7, but the voids 32 are generated in inside of the alleviation layer 31 too. The condition of the heat treatment is not limited in particular, but it is sufficient to be the temperature higher than the hardening temperature of the resin forming the alleviation layer 31. When the hardening temperature of the resin forming the alleviation layer 31 is assumed as T° C., it is preferable to set the heating temperature in a range from T° C.+5° C. to T° C.+100° C., and preferable to set the heating time from 10 minutes to 2 hours.

The size of the voids 32 to be generated can be adjusted by selecting the resin forming the alleviation layer 31 and the condition of heat treatment, and it is preferable that the diameter of the voids 32 is in a range from 5 to 300 nm. If the diameter of the voids 32 is less than 5 nm, light scattering effect may be weak, and if the diameter of the voids exceeds 300 nm, adhesiveness of the boundary of the alleviation layer 31 and the transparent electrode layer 7 becomes insufficient so that reliability of a device may be failed.

Subsequently, the transparent electrode layer 7 is provided on the surface of the alleviation layer 31, and after that, the luminescent layer 8 is formed on a surface of the alleviation layer 31 opposite to the transparent electrode layer 7. Furthermore, the opposing electrode 9 is formed on a surface of the luminescent layer 8 opposite to the transparent electrode layer 7, consequently, a plane emission device consists of an organic EL device shown in FIG. 2A is formed. As for the material of the opposing electrode 9, although Al or the like can be used, it may be a layered structure of combination of Al and other electrode material. As for the combination of the electrode materials, a layered product with alkali metal and Al, a layered product with alkali metal and silver, a layered product with halogenide of alkali metal and Al, a layered product with an oxide of alkali metal and Al, a layered product with an alkaline earth metal or rare earth metal and Al, or an alloy of these metal species and other metal are exemplified. More specifically, a layered product of sodium, sodium-potassium alloy, lithium, magnesium and Al, a magnesium-silver mixture, a magnesium-indium mixture, an aluminum-lithium alloy, a LiF/Al mixture/layered product, Al/Al$_2$O$_3$ admixture can be exemplified as examples.

In addition, it is possible to provide a hole transfer layer, an electron transfer layer, a buffer layer or a layer which decreases damage in electrode film forming between the luminescent layer 8, and the transparent electrode layer 7 and the opposing electrode 9, similar to the first embodiment.

In the plane emission device formed as above, the lights emitted in the luminescent layer 8 by applying a voltage between the transparent electrode layer 7 and the opposing electrode 9 pass through the transparent electrode layer 7, the alleviation layer 31 and the light scattering layer 2, further pass through the transparent substrate 1, and exit to outside. At this time, since the voids 32 are formed in the alleviation layer 31 on the boundary to the transparent electrode layer 7 and the light scattering structure is formed on the boundary between the transparent electrode layer 7 and the alleviation layer 31, the lights entering into the alleviation layer 31 from the transparent electrode layer 7 are scattered, and thus, total reflection of lights on the boundary face between the transparent electrode layer 7 and the alleviation layer 31 can be restrained. Furthermore, since the voids 32 are formed in the inside of the alleviation layer 31, the lights are scattered in the inside of the alleviation layer 31, and thus, incidence efficiency of lights from the light scattering layer to the transparent substrate 1 becomes higher. In this way, by restraining the total reflection on each boundary face, the lights can effectively pass through from the transparent electrode layer 7 to the alleviation layer 31, the light scattering layer 2 and the transparent substrate 1, and exit from the transparent substrate 1, and consequently, the takeout efficiency of lights emitted in the luminescent layer 8 is improved.

In addition, an intermediate layer in which a material of the transparent electrode layer 7 and a resin for forming the alleviation layer 31 are mixed may be formed on a boundary between the transparent electrode layer 7 and the alleviation layer 31 by performing heat treatment after forming the transparent electrode layer 7 on the surface of the alleviation layer 31. Since the intermediate layer is a mixture of the material of the transparent electrode layer 7 and the resin forming the alleviation layer 31, the refraction index of the intermediate layer gradually varies from the refraction index of the transparent electrode layer 7 to the refraction index of the alleviation layer 31 so that it slants from the transparent electrode layer 7 side to the alleviation layer 31 side. Therefore, there is no optical boundary face on which the refraction indexes vary between the alleviation layer 31 and the transparent electrode layer 7 or the light scattering layer 2 by forming the intermediate layer between the transparent electrode layer 7 and the alleviation layer 31, so that loss due to the total reflection on the boundary face can be eliminated. It is needless to say that voids 32 are generated in the vicinity of the boundary between the intermediate layer and the transparent electrode layer 7, in the vicinity of the boundary between the intermediate layer and the alleviation layer 31 and the inside of the intermediate layer by the heat treatment.

Subsequently, the plane emission device in accordance with the second embodiment is described specifically by practical examples. In addition, the weight average molecular weights were measured by GPC (gel permeation chromatography) as corresponding value of calibration curve which is formed of normal polystyrene with using a measuring machine of "HLC-8120" product of Tosoh Corp.

Practical Example 8

A solution was obtained by adding 803.5 masses part of isopropyl alcohol into 86.8 masses part of tetraethoxysilane, and further adding 34.7 mass part of γ-methacryloxypropyl-trymethoxysilane and 75 mass part of 0.1N-nitric acid, and mixing it well with by dispersion mill. The obtained solution was agitated two hours in thermostatic oven at 40 degrees Celsius, and thus, 5 weight % of silicone resin solution was obtained as a binder silicone resin having 1050 weight average molecular weight. Subsequently, a methyl silicone particles dispersed silicone resin solution was obtained by adding methyl silicone particles (a product of GE Toshiba silicones Co., Ltd. "Tosperal 120", mean particle diameter: 2 µm) into the silicone resin solution and dispersed by homogenizer so that methyl silicone particles/silicone resin (condensation chemical compound conversion) became 80/20 on the basis of the solid content mass standard. In addition, the above mentioned "condensation chemical compound conversion" is a mass when assuming that existing Si was $SiO_2$ in the case of tetraalkoxysilane.

Subsequently, a light scattering layer 2 of a thickness about 5 µm was formed by processes that a non-alkali glass sheet (a product of Corning Incorporated, "No. 1,737" having a refraction index 1.51) was used for the transparent substrate 1, the methyl silicone particles dispersed silicone resin solution was applied on a surface of the transparent substrate 1 with a spin coating machine in a condition of 1000 rpm and coated film was dried, after repeating the application and drying six times and the coated film was heated at 200 degrees Celsius for 30 minutes. When optical properties of the transparent substrate 1 on which the light scattering layer 2 was formed were measured with a hazemeter (a product of NIPPON DENSHOKU INDUSTRIES CO. LTD., "NDH-2000"), the haze value was 95.4 and full light transmittances was 73.4%.

Subsequently, an alleviation layer 31 having a thickness about 4 µm was formed on a surface of the light scattering layer 2 by applying an imide system resin coating material (a product of OPTMATE Corporation "HRI1783", nD=1.78, density: 18 weight %) in a condition of 2000 rpm and coated film was dried and heated at 200 degrees Celsius for 30 minutes.

Subsequently, a surface of the alleviation layer 31 was sputtered with an ITO target (a product of Tosoh company), so that an ITO film having a thickness of 120 nm was formed on the alleviation layer 31. Subsequently, the ITO film was annealed by performing heat treatment to the transparent substrate 1 on which the ITO film was formed at 300 degrees Celsius for one hour, so that a transparent electrode layer 7 having a sheet resistance 18Ω/□ was formed. At that time, when the alleviation layer 31 was observed with an electron microscope, it was confirmed that the voids 32 having diameter from 5 to 100 nm were formed with a distribution density of 20% of area along the boundary to the transparent electrode layer 7. In addition, it was confirmed that the voids were formed in inside of the alleviation layer 31 though distribution density thereof was smaller than that of the voids 32 formed on the boundary face to the transparent electrode layer 7.

Subsequently, the transparent substrate 1 on which the transparent electrode layer 7 was formed was dried and performed with UV-$O_3$ process for 15 minutes after processing a ultrasonic cleaning with ultrasonic cleaning with acetone, pure water, isopropyl alcohol for 15 minutes. After that, the transparent substrate 1 was set in a vacuum evaporation apparatus, and a film of N,N'-diphenyl-N,N'-bis(1-naphthyl)-1,1'-biphenyl-4,4'-diamine (NPB) (a product of eRay company) having a thickness of 40 nm was formed on the transparent electrode layer 7 as a hole transfer layer. Furthermore, a film of aluminum-tris(8-hydroxyquinoline) (Alq) (a product of eRay company) having a thickness of 60 nm was formed thereon as an organic luminescence layer 8 and serving as an electron transfer layer. Still furthermore, a film of LiF (a product of KOJUNDO CHEMICAL LABORATORY CO., LTD) having a thickness of 1 nm was formed thereon as an electron injection layer (or an electron transfer layer). Finally, a film of Al (a product of KOJUNDO CHEMICAL LABORATORY CO., LTD) having a thickness of 80 nm was formed on the electron injection layer by vacuum evaporation as an opposing electrode serving as a cathode.

After that, the transparent substrate 1 on which the above mentioned respective layers were formed was transmitted to a glove box of dry nitrogen atmosphere at dew point equal to or less than −80 degrees Celsius without exposing to air. On the other hand, a seal cap made of a glass was previously prepared that a water-absorption agent (a product of DYNIC CORPORATION) was pasted thereon and a seal agent of ultraviolet curing resin was applied to circumference department of the sealing cap. Subsequently, the seal cap was attached to the transparent substrate 1 by the seal agent to enclose each layer and the seal agent was hardened by ultraviolet irradiation in the glove box, so that a plane emission device consists of an organic EL device having a layered structure shown in FIG. 2A was obtained by sealing each layer by the seal cap.

A solution was obtained by adding 803.5 masses part of isopropyl alcohol into 86.8 masses part of tetraethoxysilane, and further adding 34.7 mass part of γ-methacryloxypropyltrymethoxysilane and 75 mass part of 0.1N-nitric acid, and mixing it well with by dispersion mill. The obtained solution was agitated two hours in thermostatic oven at 40 degrees Celsius, and thus, 5 weight % of silicone resin solution was obtained as a binder silicone resin having 1050 weight average molecular weight. Subsequently, a silicone resin solution containing hollow silica fine particles was obtained by adding a sol that an IPA dispersed sol (solid content: 20 mass %, dispersion medium: isopropyl alcohol, made by Catalysts and Chemicals Ltd.) of hollow silica fine particles (mean particle diameter: 60 nm, outer shell thickness: 10 nm) was diluted by isopropyl alcohol to be 5 mass % into the silicone resin solution so that hollow silica fine particles/silicone resin (condensation chemical compound conversion) became 35/30 on the basis of the solid content mass standard. Furthermore, a final coating materials composition was obtained by adding a sol that a methyl ethyl ketone dispersed sol (solid content: 20 mass %, a product of Catalysts and Chemicals Ltd.) of silica-titania compound fine particles (mean particle diameter 10 to 20 nm) which were coated faces of titania particles with silica was diluted by isopropyl alcohol to be 5 mass % into this solution so that hollow silica fine particles/silica-titania compound fine particles/silicone resin (condensation chemical compound conversion) became 35/35/30 on the basis of the weight average molecular weights.

Hereupon, the refraction index Nb of the silicone resin as the above mentioned binder formation material was 1.40, the refraction index $Nf_1$ of the hollow silica fine particles was 1.25 and the refraction index $Nf_2$ of the silica-titania fine particles was 1.85, which satisfied the relationship of $Nf_2 > Nb > Nf_1$.

Subsequently, a light scattering layer 2 of a thickness about 500 nm was formed by processes that a non-alkali glass sheet (a product of Corning Incorporated, "No. 1,737" having a refraction index 1.51) was used for the transparent substrate 1, the above mentioned coating materials composition was applied on a surface of the transparent substrate 1 with a spin coating machine in a condition of 1000 rpm, a coated film was formed by drying the applied coating materials composition, and the coated film was heat-treated by burning at 200 degrees Celsius for 30 minutes. The refraction index of the light scattering layer 2 obtained by this way was 1.45, which was smaller than the refraction index of the transparent substrate 1. In addition, the haze value of the light scattering layer 2 was 3.0, and full light transmittance was 85.7%.

After forming the light scattering layer 2 having a thickness about 500 nm in this way, a methyl silicone particle dispersed silicone resin solution was applied thereon similar to the practical example 8, and a light scattering layer having a thickness about 5 μm was formed by drying and burning the applied solution, furthermore an alleviation layer 31, a transparent electrode layer 7, a luminescent layer 8 and an opposing electrode 9 were formed and sealed the layers by a seal cap similar to the practical example 8, and consequently, a plane emission device consists of an organic EL device was obtained.

Comparative Example 5

A transparent electrode layer 7 was formed by sputtering an ITO film directly on a surface of a transparent substrate 1, and annealing it by performing heat treatment at 300 degrees Celsius for one hour. Then, a luminescent layer 8 and an opposing electrode 9 were formed and sealed by a seal cap similar to the practical example 8, consequently, a plane emission device consists of an organic EL device was obtained.

Comparative Example 6

In the practical example 8, an annealed transparent electrode layer 7 was formed by performing heat treatment at 200 degrees Celsius for one hour after sputtering the ITO film. A plane emission device consists of an organic EL device was obtained by the same processes in the practical example 8 other than the above process. In this case, the sheet resistance of the transparent electrode layer 7 was the same as that in the practical example 8, but occurrence of voids was not observed in the alleviation layer 31 when observing the alleviation layer 31 by an electron microscope, because the temperature value of heat-treating was lower.

With respect to the plane emission devices of the practical examples 8 to 9 and the comparative examples 5 to 6 obtained as above, characteristic evaluation was carried out with using a DC power supply (a product of Keithley Instruments Inc.) and a luminance meter (a product of TOPCON CORPORATION) under a condition that a current value flowing inside the device was fixed to 10 mA/cm$^2$. At that time, front intensities were measured with current efficiency (cd/A) at 10 degrees interval in an area from −180 degrees to +180 degrees in angular orientation, and total luminous flux (electrical efficiency 1 m/W) was calculated. The results were shown in table 3 in relative numeric values that the vale in the comparative example 5 was assumed as 1. In addition, there is no notable difference in the current/voltage characteristics in the practical examples 8 to 9 and the comparative examples 5 to 6. In addition, there is no notable difference in the emission spectrum in each example.

TABLE 3

|  | Current Efficiency (cd/A) | Power Efficiency (lm/W) |
| --- | --- | --- |
| Practical Example 8 | 1.8 | 1.8 |
| Practical Example 9 | 1.8 | 2.0 |
| Comparative Example 5 | 1 | 1 |
| Comparative Example 6 | 1.4 | 1.4 |

As can be seen from table 3, it is confirmed that the device in each practical example 8 to 9 was improved the takeout efficiency of lights than ones not only in the comparative example 5 but also in the comparative example 6.

The invention claimed is:
1. A plane emission device comprising a transparent substrate, a light scattering layer provided on a surface of the transparent substrate, and a luminescent body layer of organic or inorganic material, which is provided on a surface of the light scattering layer and emits light by light or electric energy, the light scattering layer comprising:
a binder and two kinds of fillers, where Nb represents a refraction index of the binder, $Nf_1$ represents, a refraction index of one of the two kinds of fillers and $Nf_2$ represents a refraction index of the other one of the two kinds of fillers, a relationship $Nf_2 > Nb > Nf_1$ is satisfied; and wherein a haze value of the light scattering layer is in a range from 2 to 50, the haze value being a ratio of a diffuse transmittance rate to a full transmittance rate multiplied by 100;

and mean particle diameters of the two kinds of fillers are respectively in a range from 5 to 200 nm.

2. The plane emission device in accordance with claim 1, wherein a refraction index of the light scattering layer is equal to or smaller than a refraction index of the transparent substrate.

3. The plane emission device in accordance with claim 1, wherein a difference $|Nf_2 - Nf_1|$ between the refraction indexes $Nf_1$ and $Nf_2$ of the two kinds of fillers is equal to or larger than 0.5.

4. The plane emission device in accordance with claim 1, wherein there is a difference of two times or more between a mean particle diameter of one filler and a mean particle diameter of the other filler, of the two kinds of fillers.

5. The plane emission device in accordance with claim 1, wherein the refraction index $Nf_1$ of one filler of the two kinds of fillers is equal to or smaller than 1.40.

6. The plane emission device in accordance with claim 1, wherein the luminescent body layer emits light upon being activated by electric energy, and a transparent electrode is provided on a surface of the light scattering layer by an application method.

7. The plane emission device in accordance with claim 1, wherein an alleviation layer for flattening surface roughness of the light scattering layer and a transparent electrode layer, in this order are provided between the light scattering layer and the luminescent body layer, and at least a light scattering structure for scattering light is provided on a boundary face or in a vicinity of the boundary face between the alleviation layer and the transparent electrode layer.

8. The plane emission device in accordance with claim 7, wherein the light scattering structure is comprises voids provided on the boundary face or in the vicinity of the boundary face between the alleviation layer and the transparent electrode layer.

9. The plane emission device in accordance with claim 8, wherein the voids are further provided inside of the alleviation layer.

10. The plane emission device in accordance with claim 8, wherein the voids have a diameter in a range from 5 to 300 nm.

* * * * *